(12) United States Patent
Hwang et al.

(10) Patent No.: US 12,495,504 B2
(45) Date of Patent: Dec. 9, 2025

(54) BALL ATTACH TOOL

(71) Applicant: Samsung Electronics Co., Ltd., Suwon-si (KR)

(72) Inventors: Hyeon Hwang, Suwon-si (KR); Sangwon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/601,190

(22) Filed: Mar. 11, 2024

(65) Prior Publication Data

US 2025/0089179 A1 Mar. 13, 2025

(30) Foreign Application Priority Data

Sep. 13, 2023 (KR) ................. 10-2023-0121736

(51) Int. Cl.
*B23K 3/00* (2006.01)
*B23K 3/06* (2006.01)
*H05K 3/34* (2006.01)

(52) U.S. Cl.
CPC ......... *H05K 3/3478* (2013.01); *B23K 3/0623* (2013.01); *H05K 2203/0195* (2013.01); *H05K 2203/041* (2013.01); *H05K 2203/082* (2013.01)

(58) Field of Classification Search
CPC ......... H05K 3/3478; H05K 2203/0195; H05K 2203/041; H05K 2203/082; B23K 3/0623; B23K 35/0244
USPC ............................. 228/180.22, 41, 245–246
See application file for complete search history.

(56) References Cited

U.S. PATENT DOCUMENTS

| | | | |
|---|---|---|---|
| 6,533,159 B1 * | 3/2003 | Cobbley | B23K 3/0623 228/41 |
| 6,595,408 B1 * | 7/2003 | Cobbley | H05K 3/3478 29/841 |
| 7,506,792 B1 | 3/2009 | Manfroy et al. | |
| 2003/0052155 A1 * | 3/2003 | Master | H05K 3/3478 228/123.1 |
| 2009/0108053 A1 | 4/2009 | Huddleston | |
| 2009/0307900 A1 * | 12/2009 | Ikeda | B23K 1/20 29/743 |
| 2023/0187228 A1 * | 6/2023 | Kim | B23K 3/0623 228/41 |

FOREIGN PATENT DOCUMENTS

| | | | | |
|---|---|---|---|---|
| CN | 1767727 A | * | 5/2006 | ........... B23K 1/0056 |
| CN | 102522345 A | | 6/2012 | |
| CN | 108098099 A | * | 6/2018 | |
| CN | 111482801 A | * | 8/2020 | |
| JP | 04065130 A | * | 3/1992 | |
| JP | H08153959 A | * | 6/1996 | |
| JP | 08307046 A | * | 11/1996 | |
| JP | H0964048 A | * | 3/1997 | |
| JP | H09270442 A | * | 10/1997 | |
| JP | H10261675 A | * | 9/1998 | |

(Continued)

*Primary Examiner* — Kiley S Stoner
(74) *Attorney, Agent, or Firm* — Wolf, Greenfield & Sacks, P.C.

(57) ABSTRACT

A ball attach tool may include a housing a valve module. The housing may include a plurality of pick-up holes configured to pick up balls when a reduced pressure is applied thereto. The valve module may control a reduced pressure applied to the pick-up holes.

20 Claims, 6 Drawing Sheets

(56) References Cited

FOREIGN PATENT DOCUMENTS

| | | | | |
|---|---|---|---|---|
| JP | 11000836 A | * | 1/1999 | |
| JP | 11008468 A | * | 1/1999 | |
| JP | H118272 A | * | 1/1999 | |
| JP | H1131714 A | * | 2/1999 | |
| JP | H1187389 A | * | 3/1999 | |
| JP | 2897356 B2 | * | 5/1999 | |
| JP | 11135991 A | * | 5/1999 | |
| JP | 2000012729 A | * | 1/2000 | ........... B23K 3/0623 |
| JP | 2000061632 A | * | 2/2000 | ........... B23K 3/0623 |
| JP | 2000068312 A | * | 3/2000 | |
| JP | 3076305 B2 | * | 8/2000 | ........... B23K 3/0623 |
| JP | 2001244285 A | | 9/2001 | |
| JP | 2004172393 A | * | 6/2004 | |
| JP | 3724003 B2 | * | 12/2005 | |
| JP | 3870363 B2 | * | 1/2007 | |
| KR | 100343520 B1 | * | 11/2002 | |
| KR | 100430580 B1 | | 5/2004 | |
| KR | 100549301 B1 | | 2/2006 | |
| KR | 20060016939 A | | 2/2006 | |
| WO | WO-2012169619 A1 | * | 12/2012 | ........... B23K 3/0623 |
| WO | WO-2018210844 A1 | * | 11/2018 | ........... B23K 1/0016 |

* cited by examiner

BALL ATTACH TOOL

CROSS-REFERENCE TO RELATED APPLICATION

This application claims priority under 35 USC § 119 to Korean Patent Application No. 10-2023-0121736, filed Sep. 13, 2023, in the Korean Intellectual Property Office (KIPO), the contents of which are herein incorporated by reference in its entirety.

BACKGROUND

1. Field

Example embodiments relate to a ball attach tool. More particularly, example embodiments relate to a tool configured to pick up a solder ball used in a packaging process and to attach the solder ball to a package substrate.

2. Description of the Related Art

Generally, solder balls used in a packaging process may be received in a ball box. The solder balls may be transferred from the ball box to a package substrate by a ball attach tool. The ball attach tool may pick up the solder balls from the ball box when a reduced pressure is applied thereto, for example, using a vacuum.

According to related arts, the ball attach tools may include a plurality of pick-up holes. When at least two solder balls may be picked up in one pick-up hole, the pick-up operation of the ball attach tool may be repeated until one pick-up hole may pick up one solder ball. Thus, a time for a ball attach process may be increased. Further, the repeated operation of the pick-up may damage the solder ball.

Furthermore, in order to pick up the solder balls having different sizes, it may be required to use a plurality of the ball attach tolls having pick-up holes corresponding to the sizes of the solder balls. Thus, an exchange of the ball attach tools may cause a delay of the attach process.

SUMMARY

Example embodiments provide a ball attach tool that may be capable of accurately picking up one solder ball and solder balls having different sizes.

According to example embodiments, a ball attach tool may include a housing and a valve module. The housing may include a plurality of pick-up holes configured to pick up balls when a reduced pressure is applied thereto. The valve module may be configured to control a supply of the reduced pressure to the pick-up holes.

According to example embodiments, a ball attach tool may include a housing and a valve module. The housing may include a main line, a plurality of branch lines, a plurality of pick-up holes and a valve hole. The main line may have a reduced pressure applied thereto. The branch lines may be branched from the main line. The pick-up holes may be connected to the branch lines and configured to pick up balls when the reduced pressure is applied. The valve hole may be connected to the main line. The valve module may be in the valve hole and configured to control the reduced pressure applied to the branch lines from the main line.

According to example embodiments, a ball attach tool may include a first block, a second block, a holder, a valve stem, a resilient member, a stopper and a controller. The first block may include a first line and a valve hole. The first line may be configured to have a reduced pressure applied thereto. The second block may make contact with a lower surface of the first block. The second block may include a second line and a plurality of branch lines. The second line may extend from a lower end of the first line. The second line may be connected to the valve hole. The branch lines may be branched from the second line. The holder may contact a lower surface of the second block. The holder may include a plurality of pick-up holes connected to the branch lines. The valve stem may be movably received in the valve hole to selectively cut off the reduced pressure applied from the second line to the branch lines. The resilient member may be configured to resiliently support the valve stem in a downward direction. The stopper may restrict a downward movement of the valve stem by the resilient member. The controller may control the operation of the stopper.

According to example embodiments, the valve module may selectively control the reduced pressure applied to the pick-up hole so that one pick-up hole may accurately pick up one solder ball. Thus, it may not be required to repeat the pick-up operation so that a time of a ball attach process may be reduced and a damage of the ball caused by repeating the pick-up operation may also be prevented.

Further, in order to pick up the balls having different sizes, the ball attach tool with the pick-up holes, which may have sizes corresponding to the sizes of the balls may be used. The reduced pressure applied to the pick-up holes having the different sizes may also be controlled by the valve module so that the pick-up holes may accurately pick up corresponding balls. As a result, a time of a ball attach process on the balls having the different sizes may also be reduced and damages of the balls may also be prevented.

BRIEF DESCRIPTION OF THE DRAWINGS

Example embodiments will be more clearly understood from the following detailed description taken in conjunction with the accompanying drawings.

FIG. 1 is a cross-sectional view illustrating a ball attach tool in accordance with example embodiments;

FIG. 2 is a bottom view illustrating the ball attach tool in FIG. 1;

FIGS. 3 and 4 are cross-sectional views illustrating an operation of the ball attach tool in FIG. 1;

FIG. 5 is a cross-sectional view illustrating a ball attach tool in accordance with example embodiments; and FIG. 6 is a bottom view illustrating the ball attach tool in FIG. 5.

DETAILED DESCRIPTION OF THE EMBODIMENTS

Hereinafter, example embodiments will be explained in detail with reference to the accompanying drawings.

Figure 1:
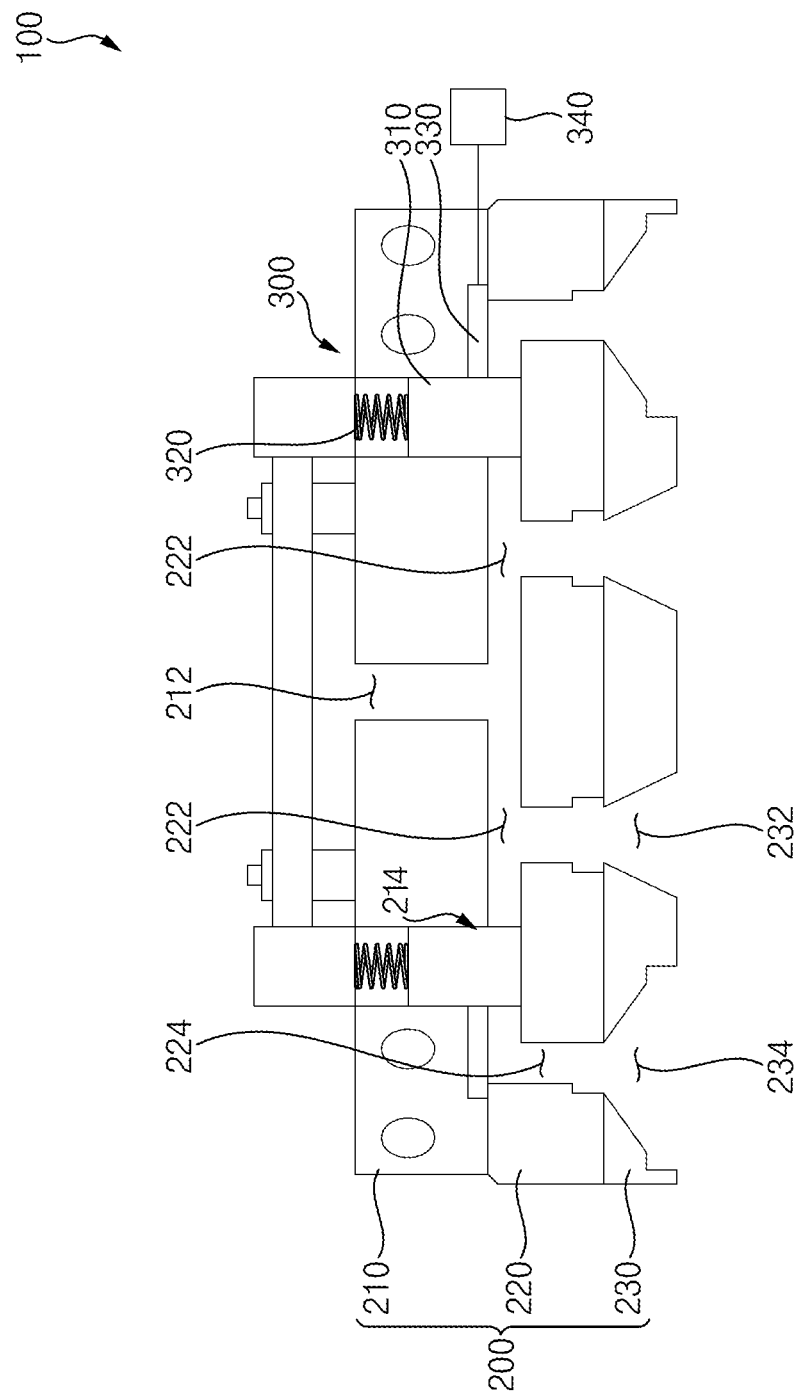
FIGS. 1 to 6 represent non-limiting, example embodiments as described herein.
Figure 2:
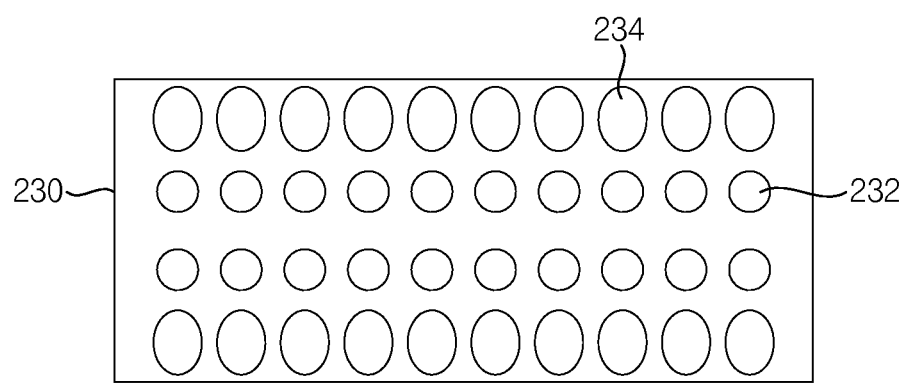

FIG. 1 is a cross-sectional view illustrating a ball attach tool in accordance with example embodiments and FIG. 2 is a bottom view illustrating the ball attach tool in FIG. 1.

Referring to FIGS. 1 and 2, a ball attach tool 100 of example embodiments may pick up a plurality of balls, for example, solder balls in a ball box when a reduced pressure is applied thereto, for example, using vacuum. The ball attach tool 100 may be moved over a package substrate. The ball attach tool 100 may then attach the balls to the package substrate. Particularly, the ball attach tool 100 of example embodiments may accurately pick up the balls having different sizes. The ball attach tool 100 may include a housing 200, a valve module 300 and an ionizer 400.

The housing 200 may be over the ball box. The housing 200 may include a main line, a plurality of branch lines 224 and a plurality of pick-up holes. The main line may receive a vacuum. That is, the main line may be configured to have a reduced pressure applied thereto, for example, from an external vacuum source, although embodiments are not limited thereto. The main line may include a first line 212 and a second line 222. The first line 212 may extend vertically from an upper surface of the housing 200 in a downward direction. The second line 222 may extend horizontally from a lower end of the first line 212. The branch lines 224 may extend vertically from the second line 222 in the downward direction. The pick-up holes may be connected to lower ends of the branch lines 224. The pick-up holes may be exposed through a lower surface of the housing 200. Thus, the vacuum may be supplied to the pick-up holes through the first line 212, the second line 222 and the branch lines 224.

In example embodiments, the housing 200 may include a first block 210, a second block 220 and a holder 230. The second block 220 may be under the first block 210. Particularly, an upper surface of the second block 220 may make contact with a lower surface of the first block 210. The holder 230 may be under the second block 220. Particularly, an upper surface of the holder 230 may make contact with a lower surface of the second block 220. The first block 210, the second block 220 and the holder 230 may have substantially the same width, but not limited thereto.

The first block 210 may include the first line 212 and a plurality of valve holes 214. The first line 212 may be formed through the first block 210 in the vertical direction. That is, the first line 212 may extend from a central portion of the upper surface to a central portion of the lower surface in the first block 210. The valve holes 214 may be formed from the lower surface of the first block 210 in an upward direction. Upper ends of the valve holes 214 may be positioned at a middle portion of the first block 210. That is, the valve holes 214 may not be exposed through the upper surface of the first block 210.

The second block 220 may include the second line 222 and the branch lines 224. The second line 222 may extend from the lower end of the first line 212 in the horizontal direction. The branch lines 224 may be extend downward from the second line in the vertical direction. The branch lines 224 may have substantially the same width, but not limited thereto.

The holder 230 may include the pick-up holes. The pick-up holes may extend from the lower ends of the branch lines 224 in the downward direction. The pick-up holes may be formed from an upper surface of the holder 230 to a lower surface of the holder 230. Thus, the pick-up holes may be exposed through the lower surface of the holder 230. The lower surface of the holder 230 may be flat. The pick-up holes may pick up the balls in the ball box. In order to prevent the balls from being damaged in the pick-up operation, the holder 230 may include a resilient material.

In example embodiments, the pick-up holes may include at least one first pick-up hole 232 and at least one second pick-up hole 234. The first pick-up hole 232 and the second pick-up hole 234 may be connected to the branch lines 224. That is, upper ends of the first pick-up hole 232 and the second pick-up hole 234 may be connected to the lower ends of the branch lines 224. The first pick-up hole 232 may be at a central portion of the holder 230. The second pick-up hole 234 may be at an edge portion of the holder 230. Alternatively, the first pick-up hole 232 may be at the edge portion of the holder 230. The second pick-up hole 234 may be at the central portion of the holder 230.

The first pick-up hole 232 may have a first size. The first pick-up hole 232 may pick up a first ball B1. The second pick-up hole 234 may have a second size larger than the first size. The second pick-up hole 234 may pick up a second ball B2 having a size larger than a size of the first ball B1.

Particularly, the first pick-up hole 232 may have a slant inner side surface. That is, the first pick-up hole 232 may have a gradually increased width from top to bottom. Thus, the longest width of the first pick-up hole 232 may be a lowermost width.

The second pick-up hole 234 may also have a slant inner side surface. That is, the second pick-up hole 234 may have a gradually increased width from top to bottom. Thus, the longest width of the second pick-up hole 234 may be a lowermost width. An inclined angle of the second pick-up hole 234 with respect to the vertical direction may be wider than an inclined angle of the first pick-up hole 232 with respect to the vertical direction. Thus, the lowermost width of the second pick-up hole 234 may be wider than the lowermost width of the first pick-up hole 232. In example embodiments, a lower end of the inner surface in the second pick-up hole 234 may have a vertical surface, but not limited thereto.

In example embodiments, the pick-up holes may have the two different sizes, but not limited thereto. For example, the pick-up holes may have at least three different sizes.

The valve module 300 may selectively control the reduced pressure applied to the first pick-up hole 232 and the second pick-up hole 234 from the main line. Particularly, the valve module 300 may control the reduced pressure applied to the second pick-up hole 234 through the branch line 224. In example embodiments, the valve module 300 may include a valve stem 310, a resilient member 320, a stopper 330 and a controller 340.

The valve stem 310 may be movably received in the valve hole 214 of the first block 210 in the vertical direction. Because the lower end of the valve hole 214 may be connected to the second line 222, a lower end of the valve stem 310 may selectively enter into the second line 222 from the valve hole 214. Thus, when the valve stem 310 may block off the second line 222, the reduced pressure may not be applied to the second pick-up hole 234.

The resilient member 320 may be connected to an upper end of the valve stem 310. The resilient member 320 may be fixed to the first block 210. The resilient member 320 may resiliently support the valve stem 310 in the downward direction. That is, the resilient member 320 may resiliently support the valve stem 310 in the valve hole 214 through the second line 222. Thus, when a resilient force of the resilient member 320 may be applied to the valve stem 310, the valve stem 310 may enter into the second line 222 to close the second line 222. In example embodiments, the resilient member 320 may include a spring, but not limited thereto.

The stopper 330 may restrict the downward movement of the valve stem 310 by the resilient member 320. Particularly, the stopper 330 may be positioned adjacent to the lower end of the valve hole 214. Further, the stopper 330 may be rotatably connected to the first block 210 with respect to the vertical direction. When the stopper 330 may be positioned in the valve hole 214, the stopper 330 may make contact with the lower end of the valve stem 310. Thus, although the resilient force of the resilient member 320 may be applied to the valve stem 310, the downward movement of the valve stem 310 may be prevented by the stopper 330 in the valve hole 214. In contrast, when the valve hole 214 may be opened by the rotation of the stopper 330, the valve stem 310 may enter into the second line 222 by the resilient member 320.

The controller 340 may control the operations of the stopper 330. Particularly, in order to pick up the first ball B1, the controller 340 may rotate the stopper 330 to open the valve hole 214. Thus, the valve stem 310 may enter into the second line 222 to close the second line 222. Therefore, the reduced pressure may be applied to only the first pick-up hole 232. In contrast, the reduced pressure may not be applied to the second pick-up hole 234. As a result, the first pick-up hole 232 may pick up only the first ball B1. In contrast, in order to pick up the second ball B2, the controller 340 may rotate the stopper 330 to close the valve hole 214. Thus, the valve stem 310 may not enter into the second line 222 to open the second line 222. Therefore, the reduced pressure may be applied to the second pick-up hole 234 as well as the first pick-up hole 232. As a result, the second pick-up hole 234 may pick up the second ball B2. Here, although reduced pressure may be applied to the first pick-up hole 232, the first pick-up hole 232 may previously pick up the first ball B1. Thus, the first pick-up hole 233 cannot pick up the second ball B2.

The ionizer 400 may be at a side of the housing 200. Particularly, the ionizer 400 may be at a side of the ball box. The ionizer 400 may remove a static electricity of the balls in the ball box to prevent the balls from being scratched.

Figure 3:
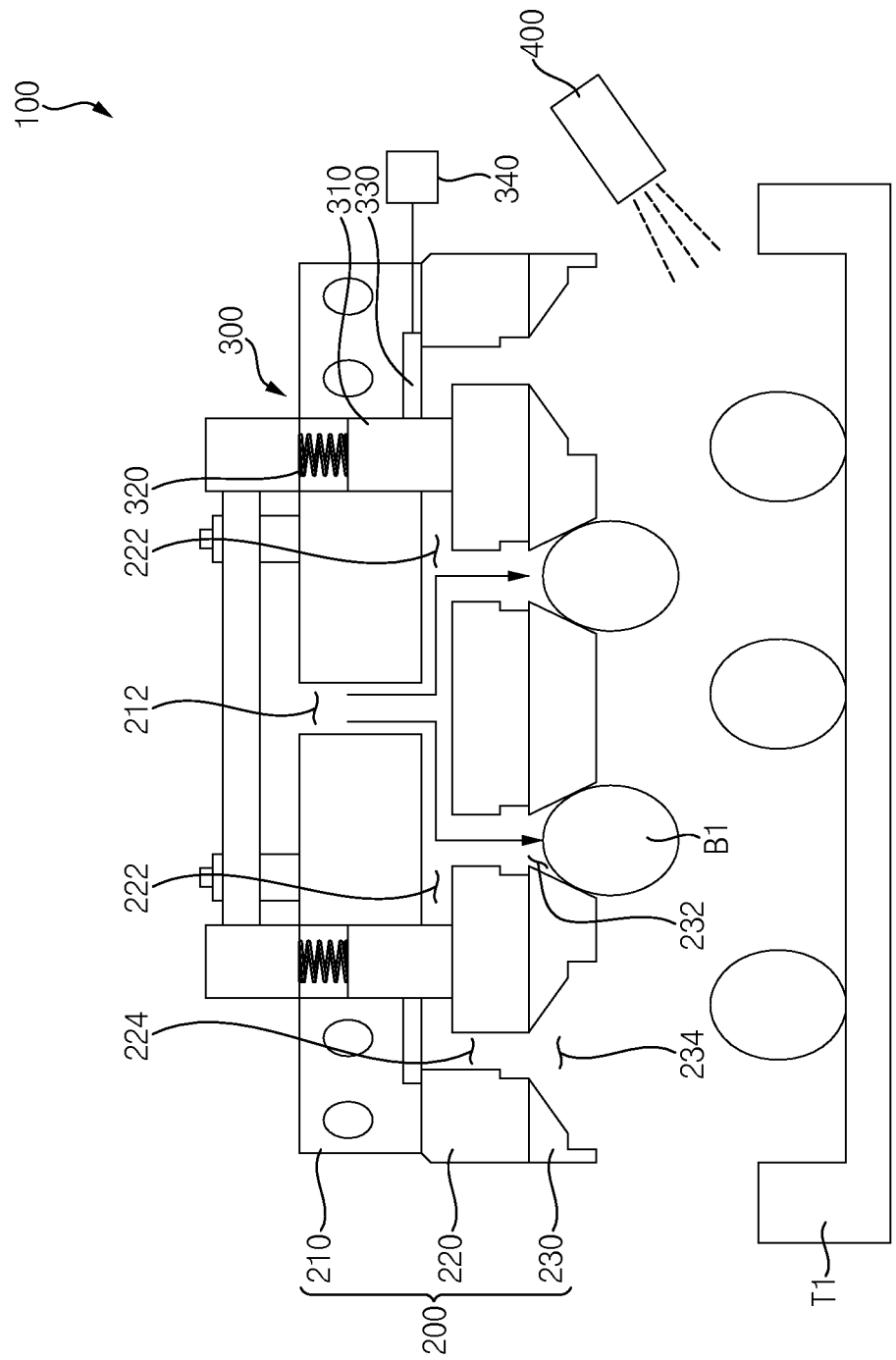
Figure 4:
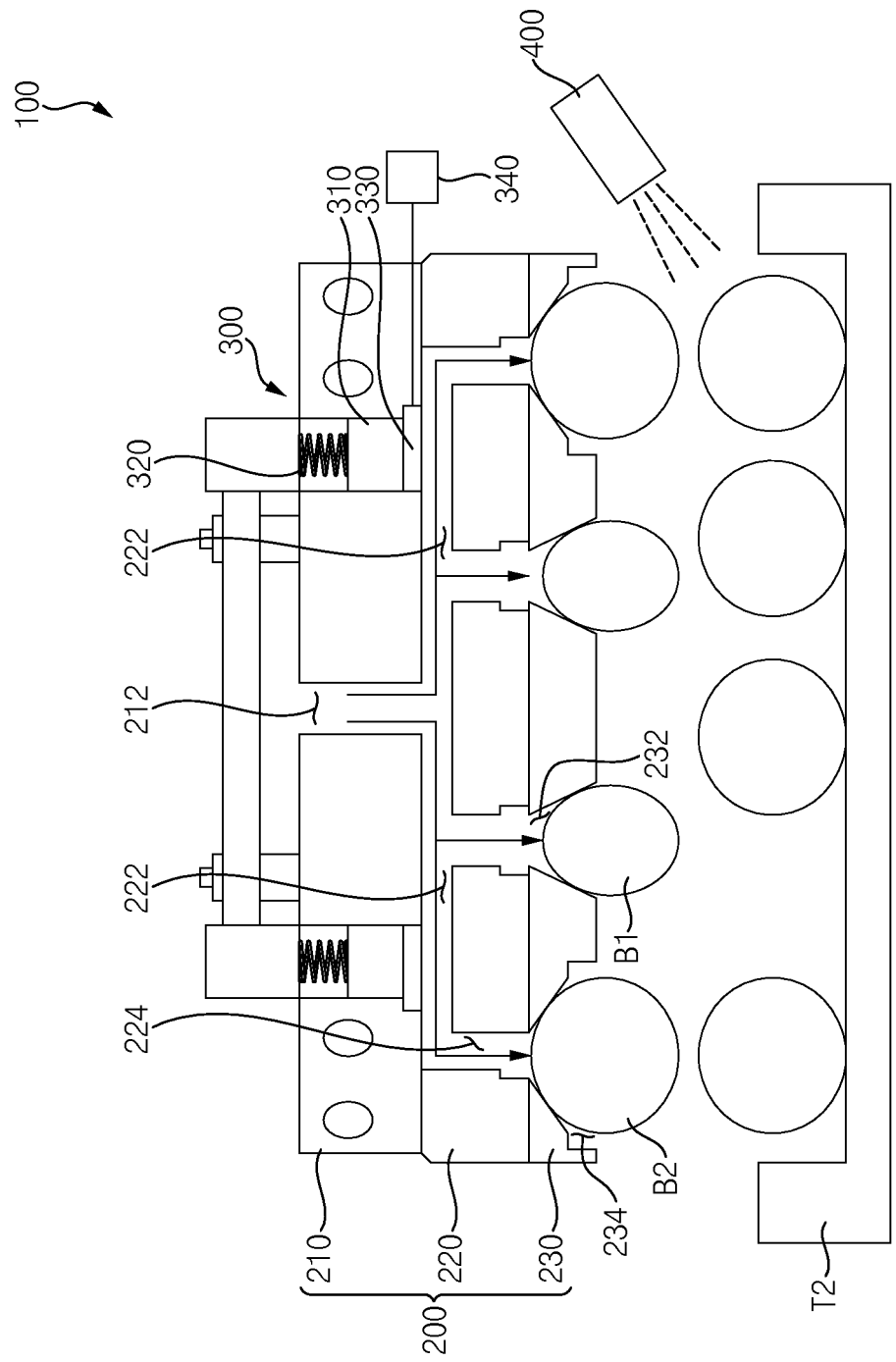

FIGS. 3 and 4 are cross-sectional views illustrating an operation of the ball attach tool in FIG. 1.

Referring to FIG. 3, the first balls B1 may be received in a first ball box T1. The ball attach tool 100 may be positioned over the first ball box T1.

The controller 340 may rotate the stopper 330 to open the valve hole 214. Thus, the valve stem 310 may enter into the second line 222 by the resilient member 320 to close the second line 222. The vacuum or reduced pressure, which may be continuously applied through the first line 212 and the second line 222, may be blocked by the valve stem 310. Thus, the reduced pressure may not be applied to the second pick-up hole 234. In contrast, the reduced pressure may be applied to only the first pick-up hole 232 so that the first pick-up hole 232 may pick up the first ball B1 having the first size.

Referring to FIG. 4, the second balls B2 may be received in a second ball box T2. The ball attach tool 100 may be positioned over the second ball box T2.

The controller 340 may rotate the stopper 330 to close the valve hole 214. Thus, the resilient member 320 may block the valve stem 310 so that the valve stem 310 may not enter into the second line 222. The reduced pressure may be applied to the first pick-up hole 232 and the second pick-up hole 234 through the first line 212 and the second line 222. Although the reduced pressure may be applied to the first pick-up hole 232, because the first pick-up hole 232 may pick up the first ball B1, the first pick-up hole 232 cannot pick up the second ball B2. As a result, the second pick-up hole 234 may pick up the second ball B2 having the second size.

Particularly, the second ball B2 may deeply enter into the second pick-up hole 234 having the size larger than the size of the first pick-up hole 232. Thus, a lower end of the second ball B2 may be substantially coplanar with a lower end of the first ball B1. Therefore, in attaching the first ball B1 and the second ball B2 to the package substrate using the ball attach tool 100, a gap between the lower end of the first ball B1 and the package substrate may be substantially the same as a gap between the lower ends of the second ball B2 of the package substrate. That is, the ball attach tool 100 may have a same drop height for the first ball B1 and the second ball B2 toward the package substrate.

Figure 5:
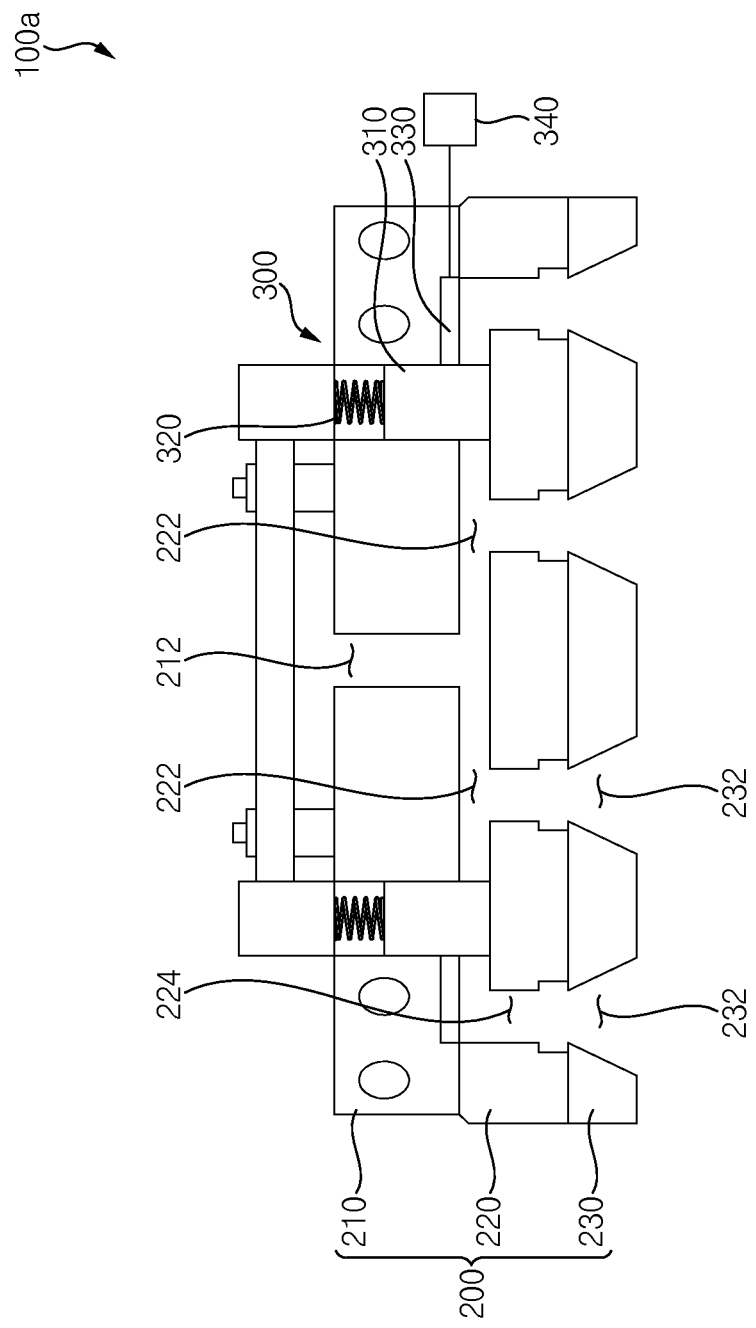
Figure 6:
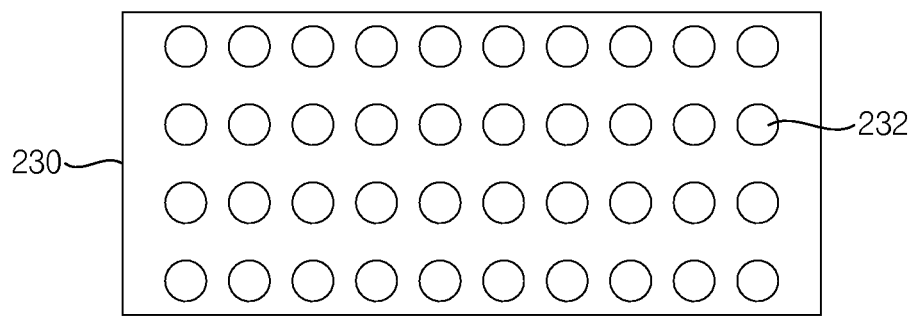

FIG. 5 is a cross-sectional view illustrating a ball attach tool in accordance with example embodiments and FIG. 6 is a bottom view illustrating the ball attach tool in FIG. 5.

A ball attach tool 100a of example embodiments may include elements substantially the same as those of the ball attach tool 100 in FIG. 1 except for a size of a pick-up hole. Thus, the same reference numerals may refer to the same elements and any further illustrations with respect to the same elements may be omitted herein for brevity.

Referring to FIGS. 5 and 6, pick-up holes of example embodiments may have substantially the same size. For example, the size of the pick-up holes may be substantially the same as the size of the first pick-up hole 232. Alternatively, the size of the pick-up holes may be substantially the same as the size of the second pick-up hole 234.

When the pick-up holes may have the same size, the valve module 300 may accurately control the reduced pressure applied to the pick-up holes so that one pick-up hole may pick up one ball. Thus, it may not be required to repeat the pick-up operation.

According to example embodiments, the valve module may selectively control the reduced pressure applied to the pick-up hole so that one pick-up hole may accurately pick up one solder ball. Thus, it may not be required to repeat the pick-up operation so that a time of a ball attach process may be reduced and a damage of the ball caused by repeating the pick-up operation may also be prevented.

Further, in order to pick up the balls having different sizes, the ball attach tool with the pick-up holes, which may have sizes corresponding to the sizes of the balls may be used. The reduced pressure applied to the pick-up holes having the different sizes may also be controlled by the valve module so that the pick-up holes may accurately pick up corresponding balls. As a result, a time of a ball attach process on the balls having the different sizes may also be reduced and damages of the balls may also be prevented.

The foregoing is illustrative of example embodiments and is not to be construed as limiting thereof. Although a few example embodiments have been described, those skilled in the art will readily appreciate that many modifications are possible in the example embodiments without droplet departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A ball attach tool comprising:
a housing including a plurality of pick-up holes configured to pick up balls when a reduced pressure is applied thereto, wherein the housing comprises:
a main line configured to have the reduced pressure applied thereto, the main line comprising:

a first line extending downward from an upper surface of the housing in a vertical direction; and
a second line extending from a lower end of the first line in a horizontal direction and connected to a plurality of branch lines;
the plurality of branch lines branched from the main line and connected to the plurality of pick-up holes;
a first block including the first line;
a second block contacting a lower surface of the first block and including the second line; and
a holder contacting a lower surface of the second block and including the plurality of pick-up holes; and
a valve module configured to control the reduced pressure applied to the plurality of pick-up holes.

2. The ball attach tool of claim 1, wherein the plurality of branch lines extend downward from the second line in the vertical direction.

3. The ball attach tool of claim 1, wherein the plurality of pick-up holes comprise:
at least one first pick-up hole having a first size; and
at least one second pick-up hole having a second size different from the first size.

4. The ball attach tool of claim 3, wherein the second size is larger than the first size.

5. The ball attach tool of claim 4, wherein the first pick-up hole and the second pick-up hole each have a respective gradually increased width from top to bottom, and a lowermost width of the second pick-up hole is wider than a lowermost width of the first pick-up hole.

6. The ball attach tool of claim 1, wherein the plurality of pick-up holes have substantially a same size.

7. A ball attach tool, comprising:
a housing including a plurality of pick-up holes configured to pick up balls when a reduced pressure is applied thereto; and
a valve module configured to control the reduced pressure applied to the plurality of pick-up holes, wherein the valve module comprises:
a valve hole formed in the housing along a vertical direction;
a valve stem movably received in the valve hole to selectively stop the reduced pressure from being applied to the plurality of pick-up holes;
a resilient member configured to resiliently support the valve stem in a downward direction;
a stopper configured to selectively restrict a downward movement of the valve stem by the resilient member; and
a controller configured to control an operation of the stopper.

8. The ball attach tool of claim 1, further comprising an ionizer configured to remove a static electricity from the balls.

9. A ball attach tool comprising:
a housing including a main line configured to have a reduced pressure applied thereto, a plurality of branch lines branched from the main line, a plurality of pick-up holes connected to the branch lines and configured to pick up balls when the reduced pressure is applied, and a valve hole connected to the main line, wherein the main line comprises:
a first line extending downward from an upper surface of the housing in a vertical direction; and
a second line extending from a lower end of the first line in a horizontal direction and connected to the branch lines,
wherein the valve hole extends from the upper surface of the housing to the second line; and
a valve module in the valve hole configured to control the reduced pressure applied from the main line to the branch lines.

10. The ball attach tool of claim 9, wherein the housing comprises:
a first block including the first line and the valve hole;
a second block contacting a lower surface of the first block and including the second line; and
a holder contacting a lower surface of the second block and including the plurality of pick-up holes.

11. The ball attach tool of claim 9, wherein the plurality of pick-up holes comprise:
at least one first pick-up hole having a first size; and
at least one second pick-up hole having a second size larger than the first size.

12. The ball attach tool of claim 11, wherein the first pick-up hole and the second pick-up hole each have a respective gradually increased width from top to bottom, and a lowermost width of the second pick-up hole is wider than a lowermost width of the first pick-up hole.

13. The ball attach tool of claim 9, wherein the valve module comprises:
a valve stem movably received in the valve hole to selectively cut off the reduced pressure from the main line to the branch lines;
a resilient member configured to resiliently support the valve stem in a downward direction;
a stopper configured to selectively restrict a downward movement of the valve stem by the resilient member; and
a controller configured to control an operation of the stopper.

14. The ball attach tool of claim 9, further comprising an ionizer configured to remove a static electricity from the balls.

15. A ball attach tool comprising:
a first block including a first line configured to have a reduced pressure applied thereto and a valve hole;
a second block contacting a lower surface of the first block, the second block including a second line and a plurality of branch lines, the second line extending from a lower end of the first line and connected to the valve hole, and the branch lines branched from the second line;
a holder contacting a lower surface of the second block and including a plurality of pick-up holes connected to the branch lines;
a valve stem movably received in the valve hole to selectively cut off the reduced pressure applied from the second line to the branch lines;
a resilient member configured to resiliently support the valve stem in a downward direction;
a stopper configured to selectively restrict a downward movement of the valve stem by the resilient member; and
a controller configured to control an operation of the stopper.

16. The ball attach tool of claim 15, wherein the plurality of pick-up holes comprise:
at least one first pick-up hole having a first size; and
at least one second pick-up hole having a second size larger than the first size.

17. The ball attach tool of claim 7, further comprising an ionizer configured to remove a static electricity from the balls.

18. The ball attach tool of claim 9, further comprising an ionizer configured to remove a static electricity from the balls.

19. The ball attach tool of claim 15, further comprising an ionizer configured to remove a static electricity from balls picked up by the ball attach tool.

20. The ball attach tool of claim 7, wherein the plurality of pick-up holes comprise:
   at least one first pick-up hole having a first size; and
   at least one second pick-up hole having a second size different from the first size, wherein the second size is larger than the first size.

\* \* \* \* \*